US012568582B2

(12) United States Patent
Chen et al.

(10) Patent No.: US 12,568,582 B2
(45) Date of Patent: Mar. 3, 2026

(54) ELECTRONIC MODULE

(71) Applicant: CYNTEC CO., LTD., Hsinchu (TW)

(72) Inventors: Chien Ming Chen, Hsinchu County (TW); Da-Jung Chen, Taoyuan County (TW); Ssu-Lung Hsu, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 271 days.

(21) Appl. No.: 18/229,177

(22) Filed: Aug. 2, 2023

(65) Prior Publication Data

US 2024/0049391 A1      Feb. 8, 2024

Related U.S. Application Data

(60) Provisional application No. 63/394,298, filed on Aug. 2, 2022.

(51) Int. Cl.
| | |
|---|---|
| *H05K 1/14* | (2006.01) |
| *H05K 1/02* | (2006.01) |
| *H05K 1/11* | (2006.01) |
| *H05K 5/00* | (2006.01) |

(52) U.S. Cl.
CPC ............. *H05K 1/144* (2013.01); *H05K 1/028* (2013.01); *H05K 1/118* (2013.01); *H05K*

*1/147* (2013.01); *H05K 5/0065* (2013.01); *H05K 5/0069* (2013.01); *H05K 2201/10939* (2013.01)

(58) Field of Classification Search
CPC ............................... H05K 1/144; H05K 1/028
USPC ........................................... 174/260
See application file for complete search history.

(56) References Cited

U.S. PATENT DOCUMENTS

| | | | |
|---|---|---|---|
| 2006/0140459 A1* | 6/2006 | Cheng ................ | G06V 40/1335 |
| | | | 250/208.1 |
| 2017/0201125 A1* | 7/2017 | You ......................... | H01F 17/04 |
| 2019/0261504 A1* | 8/2019 | Chuah ...................... | H05K 1/14 |
| 2021/0099560 A1* | 4/2021 | Kim ...................... | H04M 1/0277 |
| 2022/0256705 A1* | 8/2022 | Ha ....................... | H01L 25/0657 |

* cited by examiner

*Primary Examiner* — Andargie M Aychillhum
(74) *Attorney, Agent, or Firm* — CKC & Partners Co., LLC

(57) ABSTRACT

An electronic module, comprising: a first electronic device, a first circuit board disposed over the first top surface, and a second circuit board disposed under the bottom surface of the body of the first electronic device, wherein a plurality of conductors are disposed over a first lateral surface for electrically connecting the first circuit board and the second circuit board, wherein a plurality of electrodes of the electronic module are disposed on a bottom surface of the second circuit board.

19 Claims, 12 Drawing Sheets

100

100

100

100

100

ELECTRONIC MODULE

CROSS-REFERENCES TO RELATED APPLICATIONS

The present application claims the benefit of U.S. Provisional Application Ser. No. 63/394,298 filed on Aug. 2, 2022, which is hereby incorporated by reference herein and made a part of the specification.

BACKGROUND OF THE INVENTION

I. Field of the Invention

The invention relates to an electronic module and, in particular, to an electronic module with an inductor.

II. Description of the Related Art

The number of electronic devices in an electronic module is gradually increasing while electronic modules are becoming smaller and smaller. Thus, how to reduce the parasitic inductance as well as the PCB footprint of an electronic module becomes an important issue.

SUMMARY OF THE INVENTION

One objective of the present invention is to provide an electronic module having a stacking structure that can reduce the length of the conductive path of the circuit for reducing parasitic inductance.

One objective of the present invention is to provide an electronic module having a stacking structure that can reduce the PCB footprint by 50%.

In one embodiment, an electronic module is disclosed, wherein the electronic module comprises: a first electronic device, comprising a body having a top surface, a bottom surface, and a plurality of lateral surfaces; a first circuit board, disposed over the first top surface, wherein at least one second electronic device is disposed on the first circuit board and electrically connected to the first circuit board; and a second circuit board, wherein the second circuit board is disposed under the bottom surface of the body of the first electronic device, wherein a plurality of conductors are disposed over a first lateral surface for electrically connecting the first circuit board and the second circuit board, wherein a plurality of electrodes of the electronic module are disposed on a bottom surface of the second circuit board.

In one embodiment, a first lead is disposed on the body, wherein a first portion of the first lead is disposed on the bottom surface of the body and extends to a second portion of the first lead disposed on the top surface of the body via a third portion of the first lead disposed over a first lateral surface of the body, wherein the first portion of the first lead is electrically connected to the first circuit board, and the second portion of the first lead is electrically connected to the second circuit board.

In one embodiment, a first flexible circuit board is disposed on the first lateral surface of the body, wherein the first flexible circuit board comprises at least one conductive layer for electrically connecting the first circuit board and the second circuit board.

In one embodiment, a first portion of a contiguous flexible circuit board is disposed on the bottom surface of the body and extends to a second portion of the contiguous flexible circuit board disposed above the top surface of the body via a third portion of the contiguous flexible circuit board disposed over a first lateral surface of the body, wherein the second portion of the contiguous flexible circuit board is electrically connected to the first circuit board.

In one embodiment, the plurality of electrodes of the electronic module comprise a plurality of surface-mounted pads disposed on the bottom surface of the second circuit board.

In one embodiment, the body is a magnetic body, wherein the first electronic device is an inductor comprising a coil disposed in the magnetic body.

In one embodiment, the body is a magnetic body, and the first electronic device comprises two inductors, wherein each inductor comprises a corresponding coil disposed in the magnetic body.

In one embodiment, at least one first electrode of the first electronic device is disposed on the top surface of the body and electrically connected to the first circuit board.

In one embodiment, a plurality of electrodes of the first electronic device are disposed on the top surface of the body and electrically connected to the first circuit board.

In one embodiment, a second plurality of electrodes of the first electronic device are disposed on the bottom surface of the body, wherein the second plurality of electrodes of the first electronic device are electrically connected to the second circuit board.

In one embodiment, a first power pin and a second power pin are disposed on a lateral surface of the body, wherein the first power pin and the second power pin are separated by a gap, wherein a metal layer is disposed over the first lateral surface of the body and covers at least one portion of the first power pin, the gap, and at least one portion of the second power pin.

In one embodiment, the first power pin is extended to the top surface and the bottom surface of the body, and the second power pin is extended to the top surface and the bottom surface of the body, wherein the first power pin is electrically connected to a voltage-supplying node, and the second power pin is electrically connected to a ground.

In one embodiment, the voltage-supplying node is an input terminal of the electronic module for receiving an input voltage to the electronic module.

In one embodiment, the voltage-supplying node is an output terminal of the electronic module for outputting an output voltage to an external circuit.

In one embodiment, the metal layer is a metal plate.

In one embodiment, a first insulating layer is disposed on the first lateral surface of the body, and the first power pin is disposed on the first insulating layer, wherein a second insulating layer is disposed on the first insulating layer, and the metal plate is disposed on the second insulating layer.

In one embodiment, a first adhesive material is disposed between the first insulating layer and the first lateral surface of the body, and a second adhesive material is disposed between the first power pin and the second insulating layer.

In one embodiment, the first circuit board is a PCB, wherein the second circuit board is a first portion of a contiguous flexible circuit board disposed under the bottom surface of the body, wherein a second portion of the contiguous circuit board is disposed over the first lateral surface to electrically connected to the first circuit board.

In one embodiment, an electronic module is disclosed, wherein the electronic module comprises: a first electronic device, comprising a body having a top surface, a bottom surface, and a plurality of lateral surfaces; a first power pin, wherein a first portion of the first power pin is disposed on the top surface of the body and extends to a second portion of the first power pin disposed on the bottom surface of the body via a third portion of the first power pin disposed on a first lateral surface of the body; and a second power pin, wherein a first portion of the second power pin is disposed on the top surface of the body and extends to a second portion of the second power pin disposed on the bottom surface of the body via a third portion of the second power pin disposed on the first lateral surface of the body; a metal layer, disposed over the first lateral surface of the body and covering at least one portion of the first power pin, at least one portion of the second power pin, and a gap between the first power pin and the second power pin.

BRIEF DESCRIPTION OF THE DRAWINGS

The present invention can be more fully understood by reading the subsequent description and examples with references made to the accompanying drawings, wherein.

DETAILED DESCRIPTION OF THE INVENTION

Figure 1:
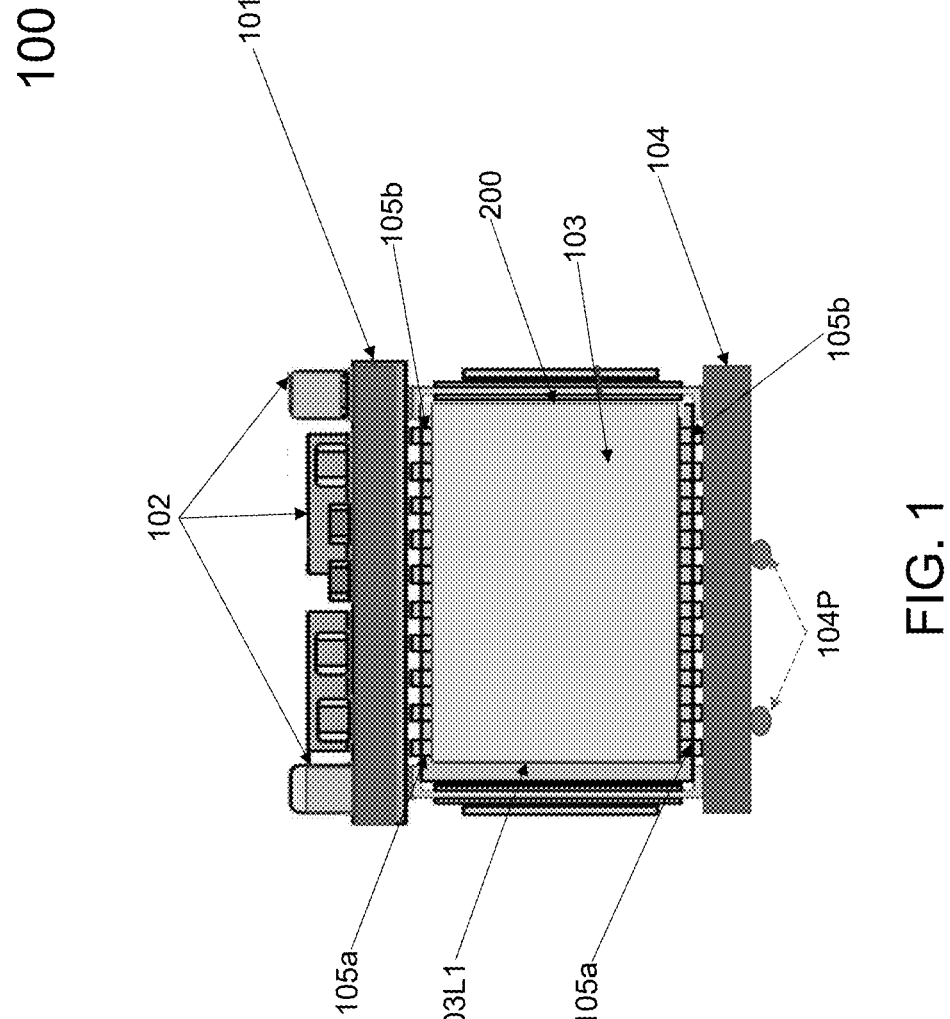
FIG. 1 is a cross-sectional side view of an electronic module according to one embodiment of the invention.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features are formed between the first and second features, such that the first and second features are not in direct contact. Besides, the present disclosure may repeat reference numerals and/or letters in the various examples.

This repetition is for simplicity and clarity and does not in itself dictate a relationship between the various embodiments and/or configurations discussed.

FIG. 1 is a cross-sectional side view of an electronic module 100 according to one embodiment of the invention. As shown in FIG. 1, the electronic module 100 comprises a first electronic device 200 comprising a body 103 having a top surface, a bottom surface, and a plurality of lateral surfaces; a first circuit board 101 disposed over the top surface of the body 103, wherein at least one second electronic device 102 is disposed on the first circuit board 102 and electrically connected to the first circuit board 101; and a second circuit board 104 disposed under the bottom surface of the body 103, wherein a plurality of conductors 105a, 105b are disposed over a first lateral surface 103L1 of the body 103 for electrically connecting the first circuit board 101 and the second circuit board 104, wherein a plurality of electrodes 104P of the electronic module 100 are disposed on a bottom surface of the second circuit board 104.

Figure 2:
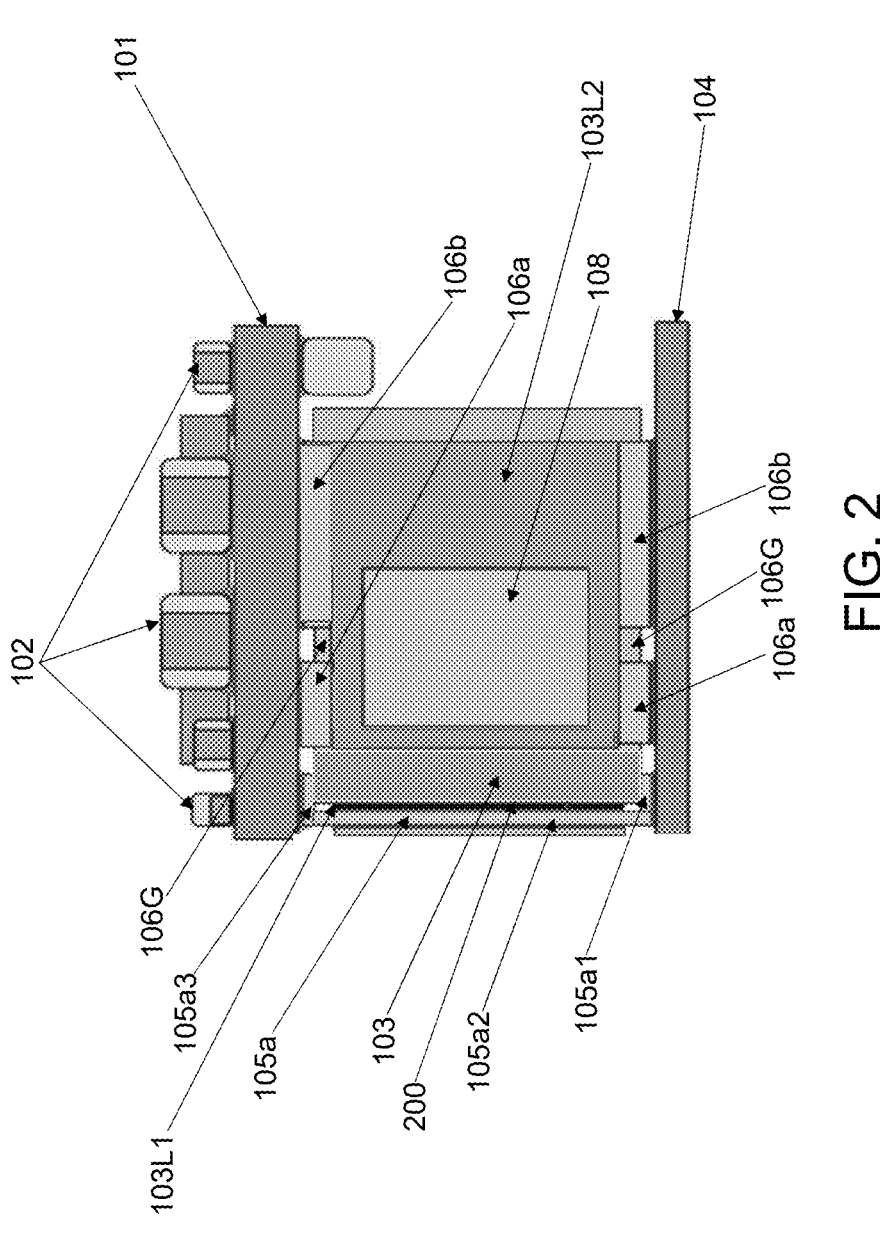
FIG. 2 is a cross-sectional side view of an electronic module according to one embodiment of the invention.

In one embodiment, as shown in FIG. 2, a first lead 105a is disposed on the body 103, wherein a first portion 105a1 of the first lead 105a is disposed on the bottom surface of the body 103 and extends to a second portion 105a3 of the first lead 105a disposed on the top surface of the body 103 via a third portion 105a2 of the first lead 105a disposed over a lateral surface 103L1 of the body 103, wherein the first portion 105a1 of the first lead 105a is electrically connected to the second circuit board 104, and the second portion 105a3 of the first lead 105a is electrically connected to the first circuit board 101.

In one embodiment, the first electronic device 200 is an inductor comprising a coil disposed inside the body 103.

In one embodiment, the body 103 is a magnetic body, wherein the coil is disposed in the magnetic body 103.

In one embodiment, the inductor is a choke.

In one embodiment, the first electronic device 200 comprises two inductors, wherein each inductor comprises a corresponding coil disposed in the body 103.

In one embodiment, each of the two inductors is a choke.

In one embodiment, the body 103 is a magnetic body, wherein each coil is disposed inside the magnetic body 103.

In one embodiment, as shown in FIG. 2, a first power pin 106a and a second power pin 106b are disposed on a lateral surface 103L2 of the body 103, wherein the first power pin 106a and the second power pin 106b are separated by a gap 106G, wherein a metal layer 108 is disposed over the lateral surface 103L2 of the body 103 and covers at least one portion of the first power pin 106a, the gap 106G, and at least one portion of the second power pin 106b. The metal layer 108 not only can shield EMI but also can reduce the parasitic inductance of the current loop and increase the efficiency of the electronic module 100.

In one embodiment, as shown in FIG. 2, the first power pin 106a is used for connecting with a voltage-supplying node, and the second power pin 106b is used for connecting with a ground.

In one embodiment, as shown in FIG. 2, the first power pin 106a is extended to the top surface and the bottom surface of the body 103, and the second power pin 106b is extended to the top surface and the bottom surface of the body 103.

In one embodiment, the first power pin 106a is electrically connected to the first circuit board 101 and the second circuit board 104, and the second power pin 106b is electrically connected to the first circuit board 101 and the second circuit board 104.

In one embodiment, the metal layer 108 is a metal plate.

Figure 3:
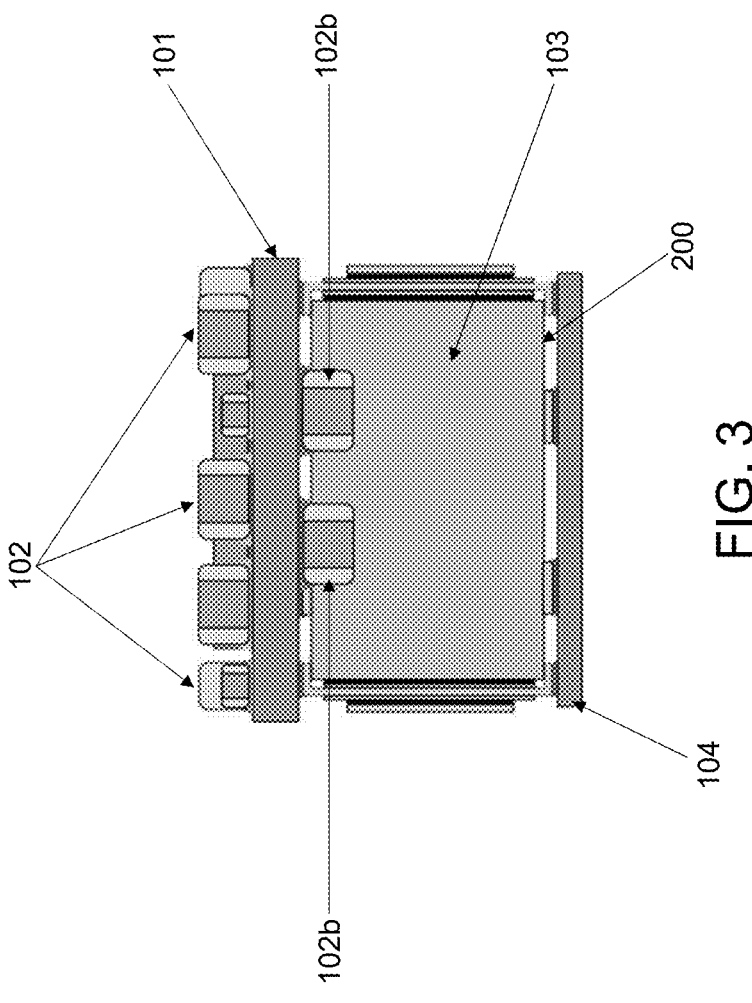
FIG. 3 is a cross-sectional side view of an electronic module according to one embodiment of the invention.

In one embodiment, as shown in FIG. 3, a plurality of electronic devices 102*b* are disposed on the bottom surface of the circuit board 101.

Figures 4A, 4B, 4C:
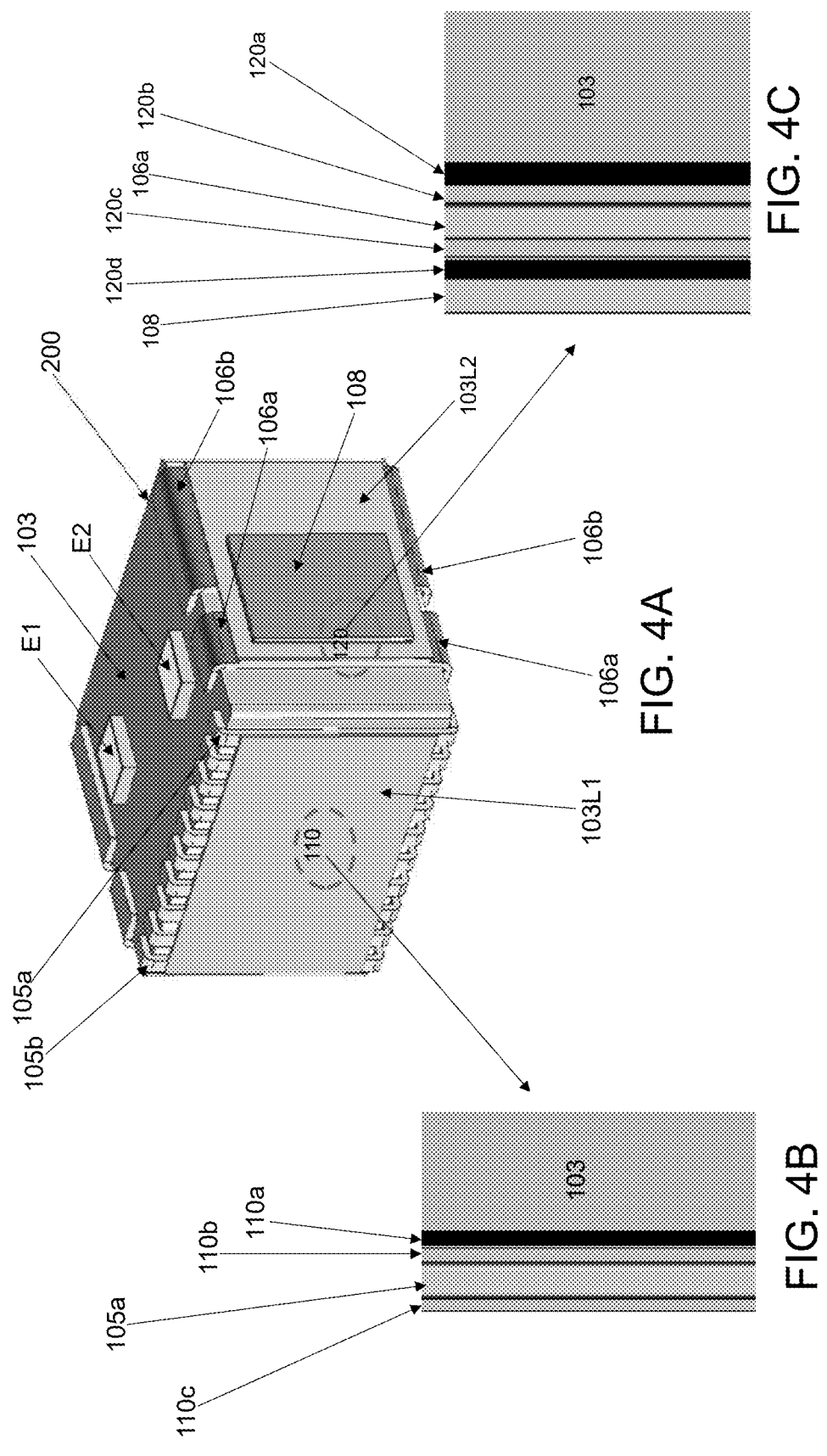
FIG. 4A is a top view of an electronic module according to one embodiment of the invention.
FIG. 4B is an enlarged view of a region of a lateral surface of an electronic module according to one embodiment of the invention.
FIG. 4C is an enlarged view of a region of a lateral surface of an electronic module according to one embodiment of the invention.

FIG. 4A is a top view of the electronic module according to one embodiment of the invention; FIG. 4B is an enlarged view of a region 110 on a lateral surface 103L1 of the body 103 of the electronic module according to one embodiment of the invention; and FIG. 4C is an enlarged view of a region 120 on a lateral surface 103L2 of the body 103 of the electronic module according to one embodiment of the invention.

In one embodiment, as shown in FIG. 4A, at least one electrode E1, E2 of the first electronic device 200 is disposed on the top surface of the body 103 and electrically connected to the first circuit board 101.

In one embodiment, as shown in FIG. 4A, a plurality of electrodes E1, E2 of the first electronic device 200 are disposed on the top surface of the body 103 and electrically connected to the first circuit board 101.

In one embodiment, at least one electrode of the first electronic device 200 is disposed on the bottom surface of the body 103 and electrically connected to the second circuit board 104.

In one embodiment, a plurality of electrodes of the first electronic device 200 are disposed on the bottom surface of the body 103 and electrically connected to the second circuit board 104.

In one embodiment, as shown in FIG. 4B, a first insulating layer 110*b* is disposed on the first lateral surface 103L1 of the body 103, and the first signal pin 105*a* is disposed on the first insulating layer 110*b*, wherein a second insulating layer 110*c* is disposed on the first signal pin 105*a*. In one embodiment, the second signal pin 105*b* is disposed on the first insulating layer 110*b*, wherein the second insulating layer 110*c* is disposed on the second signal pin 105*b*.

In one embodiment, as shown in FIG. 4B, the first insulating layer 110*b* is adhered to the first lateral surface 103L1 of the body 103 via an adhesive layer 110*a*.

In one embodiment, as shown in FIG. 4C, a first insulating layer 120*b* is disposed on the second lateral surface 103L2 of the body 103, and the first power pin 106*a* is disposed on the first insulating layer 120*b*, wherein a second insulating layer 120*c* is disposed on the first power pin 106*a*, and a metal layer 108 is disposed on the second insulating layer 120*c*. In one embodiment, the second power pin 106*b* is disposed on the first insulating layer 120*b*, wherein the second insulating layer 120*c* is disposed on the second power pin 106*b*

In one embodiment, as shown in FIG. 4C, the first insulating layer 120*b* is disposed on the second lateral surface 103L2 of the body 103 via an adhesive layer 120*a*.

In one embodiment, as shown in FIG. 4C, the metal layer 108 is adhered to the second insulating layer 120*c* via an adhesive layer 120*d*.

In one embodiment, as shown in FIG. 4C, the metal layer 108 is a metal plate.

In one embodiment, the first circuit board 101 is a first PCB, and the second circuit board 104 is a second PCB.

Figure 5A:
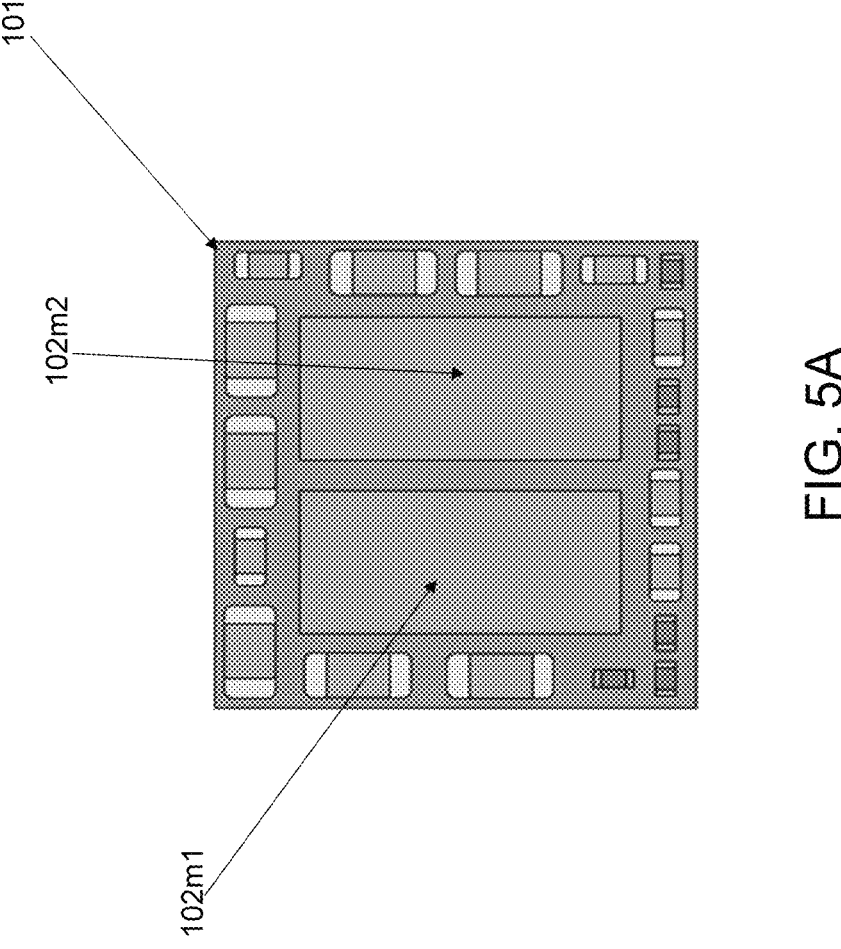
FIG. 5A is a top view of an electronic module according to one embodiment of the invention.

In one embodiment, as shown in FIG. 5A, the plurality of electronic devices 102 comprise a first MOSFET IC (Integrated Circuit) 102*m*1 and a second MOSFET IC (Integrated Circuit) 102*m*2 disposed on the top surface of the body 103.

In one embodiment, the first MOSFET IC (Integrated Circuit) 102*m*1 comprises at least one MOSFET and the second MOSFET IC (Integrated Circuit) 102*m*2 comprises at least one MOSFET.

In one embodiment, the first MOSFET IC (Integrated Circuit) 102*m*1 comprises two MOSFET(s) and the second MOSFET IC (Integrated Circuit) 102*m*2 comprises two MOSFET(s).

Figure 5B:
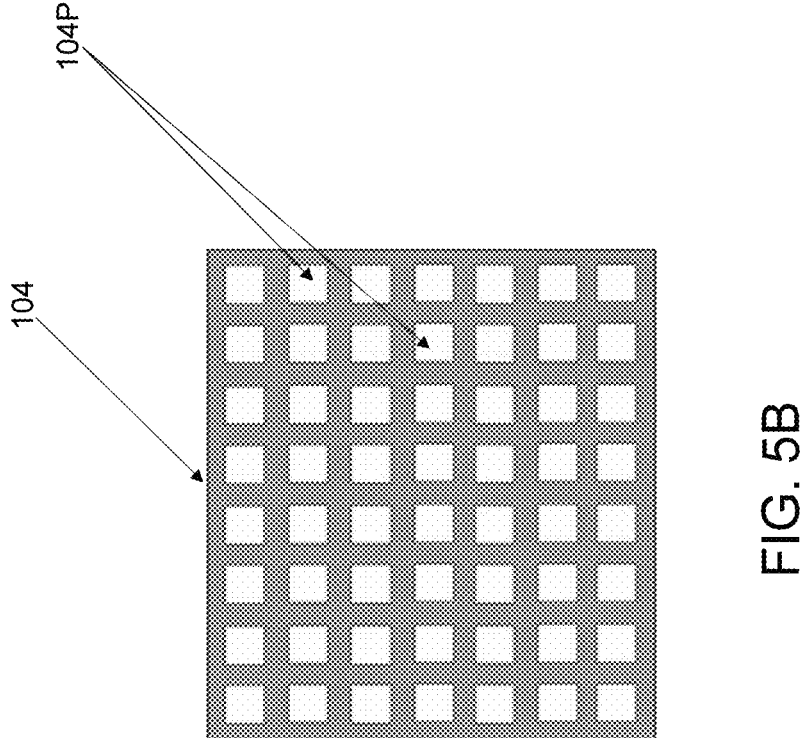
FIG. 5B is a bottom view of an electronic module according to one embodiment of the invention.

In one embodiment, as shown in FIG. 5B, the plurality of electrodes 104P of the electronic module 100 comprise a plurality of surface-mounted pads disposed on the bottom surface of the second circuit board 104.

Figure 6:
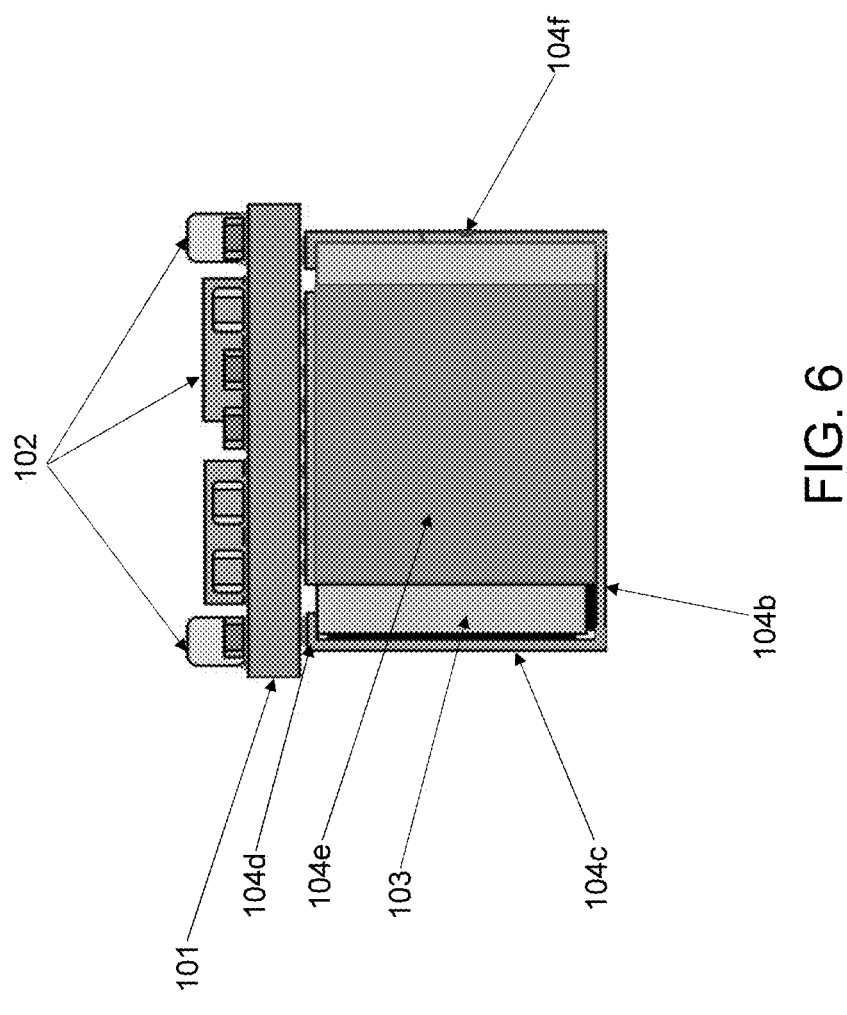
FIG. 6 is a cross-sectional side view of an electronic module according to one embodiment of the invention.

In one embodiment, as shown in FIG. 6, the first circuit board 101 is a PCB, and the second circuit board 104 is a flexible circuit board, wherein a first portion of the flexible circuit board is disposed under the bottom surface of the body 103, and a second portion of the flexible circuit board is disposed over a lateral surface such as the first lateral surface 103L1 or the second lateral surface 103L2 to electrically connecting with the first circuit board 101.

In one embodiment, as shown in FIG. 6, the first circuit board 101 is a PCB, and the second circuit board 104 is a flexible circuit board 104*b* disposed under the bottom surface of the body 103.

In one embodiment, as shown in FIG. 6, a flexible circuit board 104*c* is disposed on the first lateral surface of the body 103, wherein the flexible circuit board 104*c* comprises at least one conductive layer for electrically connecting the first circuit board 101 and the second circuit board 104.

In one embodiment, as shown in FIG. 6, a flexible circuit board 104*f* is disposed on a lateral surface of the body 103, wherein the flexible circuit board 104*f* comprises at least one conductive layer for electrically connecting the first circuit board 101 and the second circuit board 104.

In one embodiment, as shown in FIG. 6, a first portion 104*b* of a contiguous flexible circuit board is disposed on the bottom surface of the body 103 and extends to a second portion 104*d* of the contiguous flexible circuit board disposed above the top surface of the body 103 via a third portion 104*c* of the contiguous flexible circuit board disposed over a lateral surface of the body 103.

Figure 7:
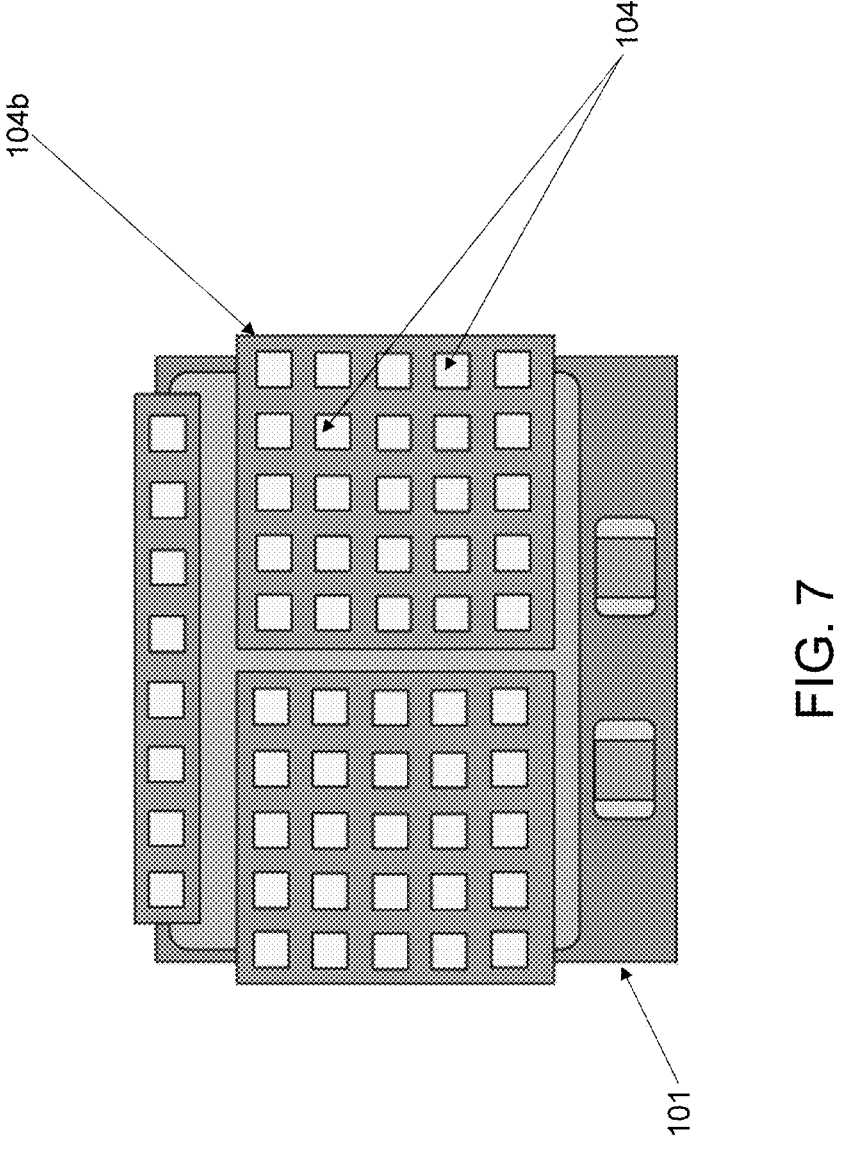
FIG. 7 is a bottom view of an electronic module according to one embodiment of the invention.

In one embodiment, as shown in FIG. 7, the first circuit board 101 is a PCB disposed on the top surface of the body 103, and the second circuit board 104 is a flexible circuit board 104*b* disposed on the bottom surface of the body 103, wherein the plurality of electrodes 104P of the electronic module 100 comprise a plurality of surface-mounted pads disposed on the bottom surface of the flexible circuit board 104*b*.

Figure 8:
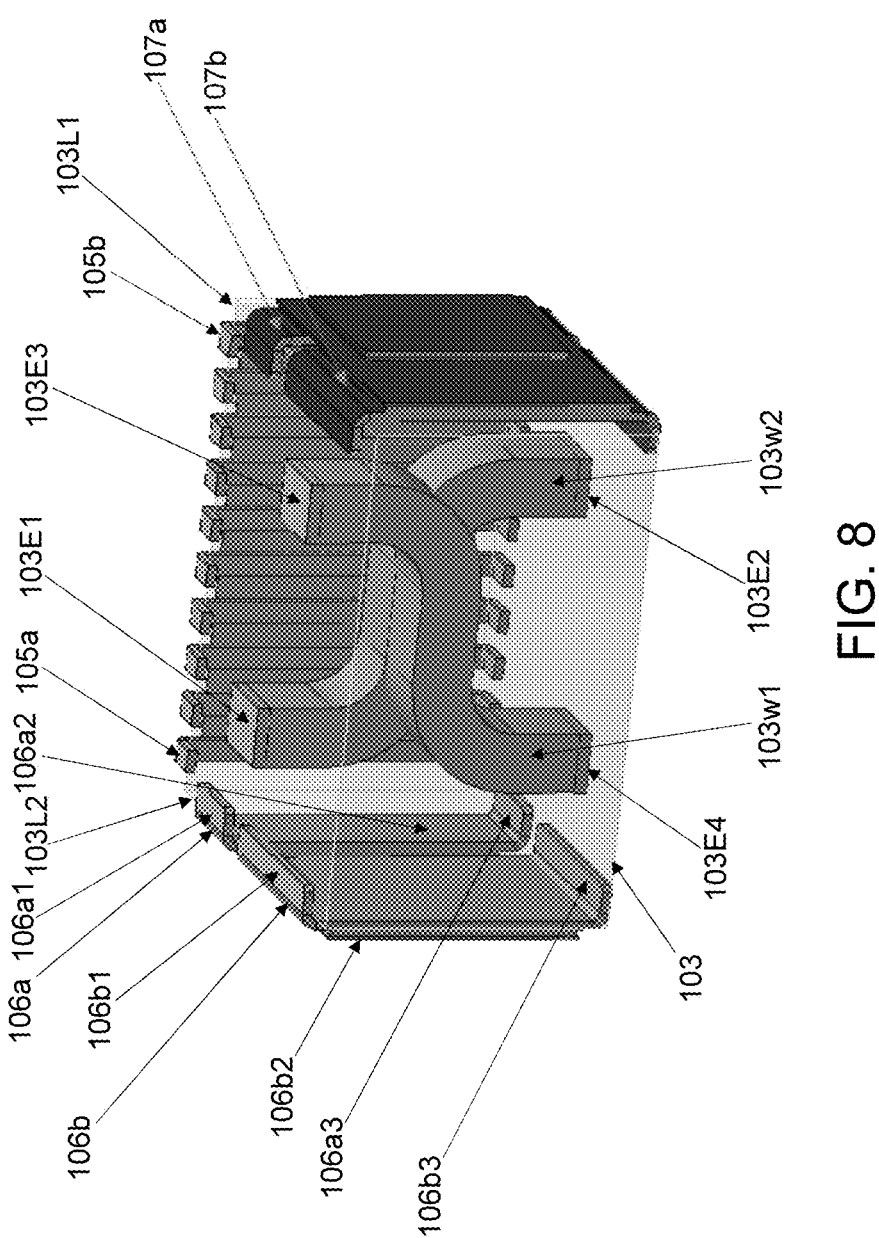
FIG. 8 is a 3D view of an electronic module according to one embodiment of the invention.

In one embodiment, as shown in FIG. 8, an electronic module 100 is disclosed, wherein the electronic module 100 comprises: a first electronic device comprising a body 103 having a top surface, a bottom surface, and a plurality of lateral surfaces; a first power pin 106*a*, wherein a first portion 106*a*1 of the first power pin 106*a* is disposed on the top surface of the body and extends to a second portion 106*a*3 of the first power pin 106*a* disposed on the bottom surface of the body 103 via a third portion 106*a*2 of the first power pin 106*a* disposed on a second lateral surface 103L2 of the body 103; and a second power pin 106*b*, wherein a first portion 106*b*1 of the second power pin 106*b* is disposed on the top surface of the body 103 and extends to a second portion 106*b*3 of the second power pin 106*b* disposed on the bottom surface of the body 103 via a third portion 106*b*2 of the second power pin 106*b* disposed on the second lateral surface 103L2 of the body 103; and a plurality of leads 105*a*, 105*b*, disposed over a first lateral surface 103L1 of the body 103, wherein each lead is used for carrying a corresponding electrical signal of the electronic module 100. In one embodiment, a third power pin 107*a* and a fourth power pin 107*b* are disposed on a third lateral surface opposite to the second lateral surface 103L2 of the body 103.

In one embodiment, the first electronic device comprises a first inductor formed by a conductive wire 103*w*1 disposed in the body 103, wherein a first terminal part of the conductive wire 103*w*1 is electrically connected to an electrode 103E1 of the first inductor.

In one embodiment, the electrode 103E1 is disposed on the top surface of the body 103.

In one embodiment, the electrode 103E1 is protruded on the top surface of the body 103.

In one embodiment, a second terminal part of the conductive wire 103*w*1 is electrically connected to an electrode 103E2 of the first inductor.

In one embodiment, the electrode 103E2 is disposed on the bottom surface of the body 103.

In one embodiment, the electrode 103E2 is protruded on the bottom surface of the body 103.

In one embodiment, the first terminal part of the conductive wire 103*w*1 is electrically connected to the electrode 103E1 disposed on the top surface of the body 103 without using a conductor disposed over any lateral surface of the body 103.

In one embodiment, the second terminal part of the conductive wire 103*w*1 is electrically connected to the electrode 103E2 disposed on the bottom surface of the body 103 without using a conductor disposed over any lateral surface of the body 103.

In one embodiment, the body 103 is a magnetic body.

In one embodiment, the first electronic device further comprises a second inductor formed by a conductive wire 103*w*2, wherein the conductive wire 103*w*2 is disposed in the body 103, wherein a first terminal part of the conductive wire 103*w*2 is electrically connected to an electrode 103E3 of the second inductor.

In one embodiment, a second terminal part of the conductive wire 103*w*2 is electrically connected to an electrode 103E4 of the second inductor.

In one embodiment, the electrode 103E3 is disposed on the top surface of the body 103.

In one embodiment, the electrode 103E3 is protruded on the top surface of the body 103.

In one embodiment, the electrode 103E4 is disposed on the bottom surface of the body 103.

In one embodiment, the electrode 103E4 is protruded on the bottom surface of the body 103.

In one embodiment, the first terminal part of the conductive wire 103*w*2 is electrically connected to the electrode 103E3 disposed on the top surface of the body 103 without using a conductor disposed over any lateral surface of the body 103.

In one embodiment, the second terminal part of the conductive wire 103*w*2 is electrically connected to the electrode 103E4 disposed on the bottom surface of the body 103 without using a conductor disposed over any lateral surface of the body 103.

In one embodiment, the conductive wire 103*w*1 forms a first coil disposed in the body 103.

In one embodiment, the conductive wire 103*w*2 forms a second coil disposed in the body 103.

In one embodiment, the first circuit board 101 comprises at least one of the following: a PCB, BT (Bismaleimide Triazine) substrate, metallic substrate or ceramic substrate.

In one embodiment, the second circuit board 104 comprises at least one of the following: a PCB, BT (Bismaleimide Triazine) substrate, metallic substrate or ceramic substrate.

Figure 9A:
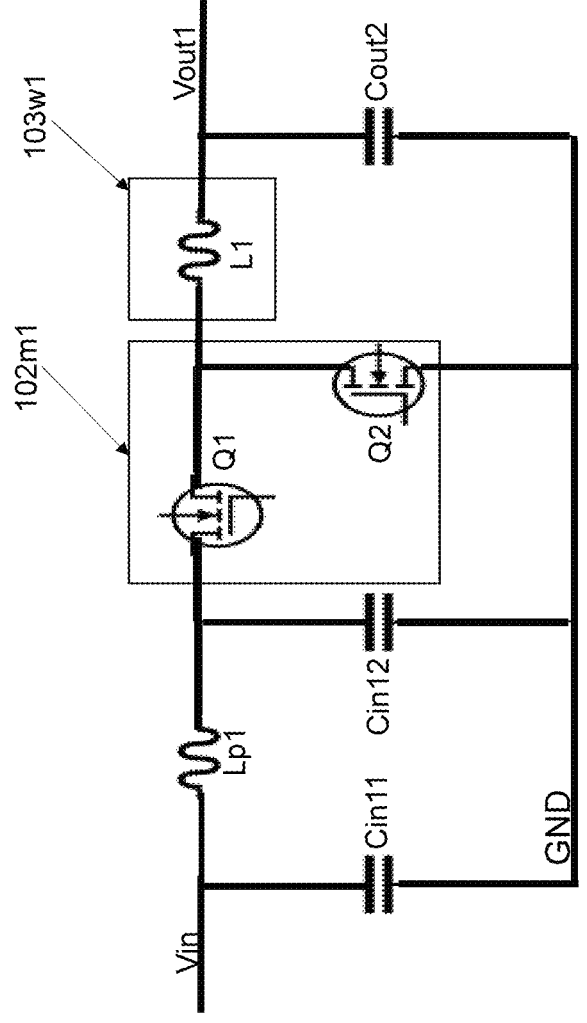
FIG. 9A is a schematic of a first power converter in an electronic module according to one embodiment of the invention.
Figure 9B:
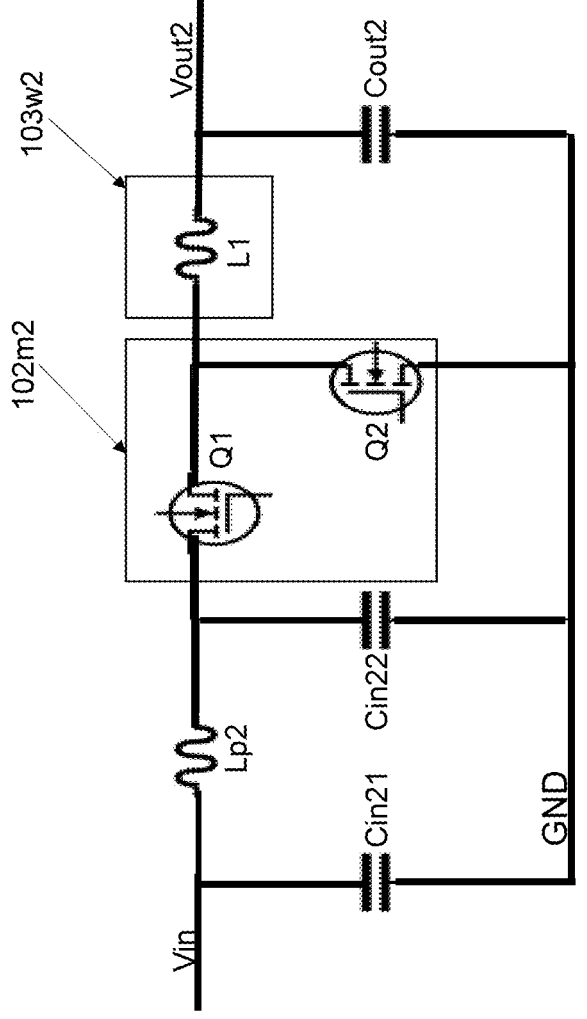
FIG. 9B is a schematic of a second power converter in the electronic module according to one embodiment of the invention.
Figure 9C:
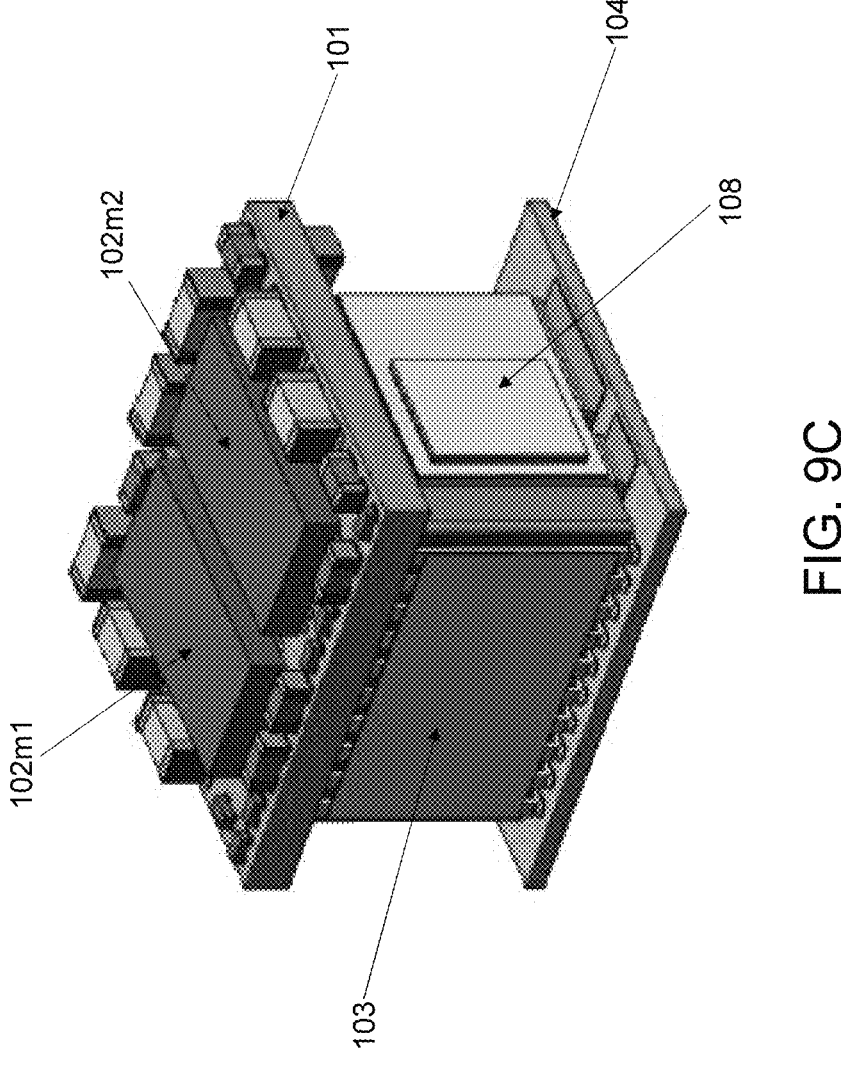
FIG. 9C is a 3D view of an electronic module according to one embodiment of the invention.

FIG. 9A is a schematic of a first power converter in an electronic module according to one embodiment of the invention; FIG. 9B is a schematic of a second power converter in the electronic module according to one embodiment of the invention; and FIG. 9C is a 3D view of an electronic module according to one embodiment of the invention.

In one embodiment, the electronic module has a first power converter and the circuit of the first power converter is shown in FIG. 9A, wherein two MOSFET(s) and are in a first MOSFET IC (Integrated Circuit) 102*m*1 of the electronic module 100 as shown in FIG. 9A, and the inductor L1 is formed by the conductive wire 103*w*1.

In one embodiment, the first MOSFET IC (Integrated Circuit) 102*m*1 receive a control signal from a first PWM controller to tuned on only one of the MOSFET Q1 and the MOSFET Q2, and the other MOSFET is turned off.

In one embodiment, the first power pin 106*a* has the input equivalent inductance Lp1.

In one embodiment, the first MOSFET IC (Integrated Circuit) 102*m*1 comprises the first PWM controller. In one embodiment, the first PWM controller is located outside the electronic module.

In one embodiment, the electronic module has a second power converter, and the circuit of the second power converter is shown in FIG. 9B, wherein two MOSFET(s) are in a second MOSFET IC (Integrated Circuit) 102*m*2 of the electronic module 100 as shown in FIG. 9B, and the inductor L2 is formed by the conductive wire 103*w*2.

In one embodiment, the second MOSFET IC (Integrated Circuit) 102*m*2 receive a control signal from a second PWM controller to tuned on only one of the MOSFET Q1 and the MOSFET Q2, and the other MOSFET is turned off.

In one embodiment, the third power pin 107*a* has the input equivalent inductance Lp2.

In one embodiment, the second MOSFET IC (Integrated Circuit) 102*m*2 comprises the second PWM controller. In one embodiment, the second PWM controller is located outside the electronic module.

In one embodiment, the inductor L1 comprises a first coil and the inductor L2 comprises a second coil, wherein the body 103 is a magnetic body and the first coil and the second coil are disposed in the magnetic body.

In one embodiment, in the first power converter and the second converter of the electronic module 100, the input voltage at the Vin terminal is greater than the output terminal at the Vout1 terminal, and the current flowing into the Vin terminal is smaller than the current flowing through the Vout1 terminal, wherein Vout1 terminal is directly output from a pad of the plurality pads 104P on the bottom surface of the second circuit board 104 to reduce power loss and increase efficiency, wherein the metal layer 108, such as a copper plate, is disposed between the first power pin 106*a* that is electrically connected to the Vin terminal and the second power pin 106*b* that is electrically connected to a ground.

In one embodiment, in the first converter and the second converter of the electronic module 100, the input voltage at the Vin terminal is smaller than the output terminal at the Vout1 terminal, and the current flowing into the Vin terminal is greater than the current flowing through the Vout1 terminal, wherein the Vin terminal is directly inputted from a pad of the plurality pads 104P on the bottom surface of the second circuit board 104 to reduce power loss and increase efficiency, wherein the metal layer 108, such as a copper plate, is disposed between the first power pin 106*a* that is electrically connected to the Vout1 terminal and the second power pin 106b that is electrically connected to a ground.

In one embodiment, as shown in FIG. 2, an electronic module 100 is disclosed, wherein the electronic module 100 comprises: a first electronic device comprising a body 103 having a top surface, a bottom surface, and a plurality of lateral surfaces; a first power pin 106a, wherein a first portion of the first power pin 106a is disposed on the top surface of the body 103 and extends to a second portion of the first power pin 106a disposed on the bottom surface of the body 103 via a third portion of the first power pin 106a disposed on a first lateral surface of the body 103; and a second power pin 106b, wherein a first portion of the second power pin 106b is disposed on the top surface of the body and extends to a second portion of the second power pin 106b disposed on the bottom surface of the body 103 via a third portion of the second power pin 106b disposed on the first lateral surface of the body 103; a metal layer 108, disposed over the first lateral surface of the body 103 and covering at least one portion of the first power pin 106a, at least one portion of the second power pin 106b, and a gap 106G between the first power pin 106a and the second power pin 106b.

In one embodiment, the first power pin 106a is extended to the top surface and the bottom surface of the body 103, and the second power pin 106b is extended to the top surface and the bottom surface of the body 103, wherein the first power pin 106a is electrically connected to a voltage-supplying node, and the second power pin 106b is electrically connected to a ground.

In one embodiment, the voltage-supplying node is an input terminal of the electronic module for receiving an input voltage to the electronic module.

In one embodiment, the voltage-supplying node is an output terminal of the electronic module for outputting an output voltage to an external circuit.

In one embodiment, the first power pin 106a is used for connecting with a power supply, and the second power pin 106b is used for connecting with a ground.

In one embodiment, the metal layer 108 is a metal plate.

In one embodiment, the metal layer 108 is a copper plate.

In the present invention, the plurality electronic devices 102 include active devices, such as an integrated circuit (IC), a MOSFET, etc., and passive components, such as resistors, capacitors Cin12, Cin22, Cout1, Cout2, and inductors.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. An electronic module, comprising:
a first electronic device, comprising a body having a top surface, a bottom surface, and a plurality of lateral surfaces;
a first circuit board, disposed over the first top surface, wherein at least one second electronic device is disposed on the first circuit board and electrically connected to the first circuit board; and
a second circuit board, wherein the second circuit board is disposed under the bottom surface of the body of the first electronic device, wherein a plurality of conductors are disposed over a first lateral surface for electrically connecting the first circuit board and the second circuit board, wherein a plurality of electrodes of the electronic module are disposed on a bottom surface of the second circuit board, wherein a first power pin and a second power pin are disposed on a lateral surface of the body, wherein the first power pin and the second power pin are separated by a gap, wherein a metal layer is disposed over the first lateral surface of the body and covers at least one portion of the first power pin, the gap, and at least one portion of the second power pin.

2. The electronic module of claim 1, wherein a first lead is disposed on the body, wherein a first portion of the first lead is disposed on the bottom surface of the body and extends to a second portion of the first lead disposed on the top surface of the body via a third portion of the first lead disposed over a first lateral surface of the body, wherein the first portion of the first lead is electrically connected to the second circuit board, and the second portion of the first lead is electrically connected to the first circuit board.

3. The electronic module of claim 1, wherein a first flexible circuit board is disposed on the first lateral surface of the body, wherein the first flexible circuit board comprises at least one conductive layer for electrically connecting the first circuit board and the second circuit board.

4. The electronic module of claim 3, wherein a first portion of a contiguous flexible circuit board is disposed on the bottom surface of the body and extends to a second portion of the contiguous flexible circuit board disposed above the top surface of the body via a third portion of the contiguous flexible circuit board disposed over a first lateral surface of the body, wherein the second portion of the contiguous flexible circuit board is electrically connected to the first circuit board.

5. The electronic module of claim 1, wherein the plurality of electrodes of the electronic module comprise a plurality of surface-mounted pads disposed on the bottom surface of the second circuit board.

6. The electronic module of claim 1, wherein the body is a magnetic body, wherein the first electronic device is an inductor comprising a coil disposed in the magnetic body.

7. The electronic module of claim 1, wherein the body is a magnetic body, and the first electronic device comprises two inductors, wherein each inductor comprises a corresponding coil disposed in the magnetic body.

8. The electronic module of claim 1, wherein at least one first electrode of the first electronic device is disposed on the top surface of the body and electrically connected to the first circuit board.

9. The electronic module of claim 1, wherein at least one first electrode of the first electronic device is protruded on the top surface of the body and electrically connected to the first circuit board.

10. The electronic module of claim 9, wherein at least one second electrode of the first electronic device is disposed on the bottom surface of the body and electrically connected to the second circuit board.

11. The electronic module of claim 1, wherein the first power pin is extended to the top surface and the bottom surface of the body, and the second power pin is extended to the top surface and the bottom surface of the body, wherein the first power pin is electrically connected to a voltage-supplying node, and the second power pin is electrically connected to a ground.

12. The electronic module of claim 11, wherein the voltage-supplying node is an input terminal of the electronic module for receiving an input voltage to the electronic module.

13. The electronic module of claim 11, wherein the voltage-supplying node is an output terminal of the electronic module for outputting an output voltage to an external circuit.

14. The electronic module of claim 1, wherein the metal layer is a metal plate.

15. The electronic module of claim 14, wherein a first insulating layer is disposed on the first lateral surface of the body, and the first power pin is disposed on the first insulating layer, wherein a second insulating layer is disposed on the first power pin, and the metal plate is disposed on the second insulating layer.

16. The electronic module of claim 15, wherein a first adhesive material is disposed between the first insulating layer and the first lateral surface of the body, and a second adhesive material is disposed between the first power pin and the second insulating layer.

17. The electronic module of claim 1, wherein the first circuit board is a PCB, wherein the second circuit board is a first portion of a contiguous flexible circuit board disposed under the bottom surface of the body, wherein a second portion of the contiguous circuit board is disposed over the first lateral surface to electrically connected to the first circuit board.

18. An electronic module, comprising:

a first electronic device, comprising a body having a top surface, a bottom surface, and a plurality of lateral surfaces;

a first power pin, wherein a first portion of the first power pin is disposed on the top surface of the body and extends to a second portion of the first power pin disposed on the bottom surface of the body via a third portion of the first power pin disposed on a first lateral surface of the body; and a second power pin, wherein a first portion of the second power pin is disposed on the top surface of the body and extends to a second portion of the second power pin disposed on the bottom surface of the body via a third portion of the second power pin disposed on the first lateral surface of the body;

a metal layer, disposed over the first lateral surface of the body and covering at least one portion of the first power pin, at least one portion of the second power pin, and a gap between the first power pin and the second power pin.

19. The electronic module of claim 18, wherein the metal layer is a metal plate.

* * * * *